(12) United States Patent
Pae et al.

(10) Patent No.: US 9,892,977 B2
(45) Date of Patent: Feb. 13, 2018

(54) FINFET AND METHOD OF FORMING FIN OF THE FINFET

(71) Applicant: Samsung Electronics Co., Ltd., Suwon-si (KR)

(72) Inventors: Sang Woo Pae, Seongnam-si (KR); Hyun Chul Sagong, Hwaseong-si (KR); Jin Ju Kim, Bucheon-si (KR); June Kyun Park, Seongnam-si (KR)

(73) Assignee: Samsing Electronics Co., Ltd. (KR)

( * ) Notice: Subject to any disclaimer, the term of this patent is extended or adjusted under 35 U.S.C. 154(b) by 0 days.

(21) Appl. No.: 15/270,502

(22) Filed: Sep. 20, 2016

(65) Prior Publication Data

US 2017/0140997 A1 May 18, 2017

(30) Foreign Application Priority Data

Nov. 18, 2015 (KR) ......................... 10-2015-0161752

(51) Int. Cl.
| | |
|---|---|
| *H01L 21/82* | (2006.01) |
| *H01L 21/30* | (2006.01) |
| *H01L 29/66* | (2006.01) |
| *H01L 21/8238* | (2006.01) |
| *H01L 21/308* | (2006.01) |
| *H01L 21/311* | (2006.01) |
| *H01L 21/3213* | (2006.01) |

(52) U.S. Cl.
CPC .. *H01L 21/823821* (2013.01); *H01L 21/3081* (2013.01); *H01L 21/31111* (2013.01); *H01L 21/32139* (2013.01); *H01L 21/823828* (2013.01); *H01L 29/6653* (2013.01); *H01L 29/6656* (2013.01); *H01L 29/66545* (2013.01)

(58) Field of Classification Search
CPC ....... H01L 21/823821; H01L 29/66545; H01L 29/6653; H01L 21/3081; H01L 29/6656; H01L 21/31111; H01L 21/32139; H01L 21/823828
USPC ......................................................... 438/199
See application file for complete search history.

(56) References Cited

U.S. PATENT DOCUMENTS

| | | |
|---|---|---|
| 8,866,206 B2 | 10/2014 | Sudo |
| 9,070,577 B2 | 6/2015 | Lee |
| 2011/0260282 A1 | 10/2011 | Kawasaki |
| 2013/0196508 A1* | 8/2013 | LiCausi ............ H01L 21/82382 438/696 |
| 2013/0334602 A1* | 12/2013 | Guo ..................... H01L 21/845 257/347 |
| 2014/0001562 A1 | 1/2014 | Liaw |
| 2014/0077303 A1 | 3/2014 | Baek |
| 2014/0332824 A1 | 11/2014 | Lin et al. |
| 2015/0076617 A1 | 3/2015 | Kim et al. |
| 2015/0206954 A1 | 7/2015 | Lin |

* cited by examiner

*Primary Examiner* — Caleen Sullivan
(74) *Attorney, Agent, or Firm* — Onello & Mello, LLP

(57) ABSTRACT

A method of generating a fin of a FinFET includes depositing a first hard mask layer on or above a first dummy gate and a second dummy gate, generating first spacers and second spacers by etching the first hard mask layer, removing only the first spacers, depositing a second hard mask layer, generating third spacers and fourth spacers by etching the second hard mask layer, removing the first dummy gate and the second dummy gate, generating first fins using the third spacers, and generating second fins using the second spacers and the fourth spacers.

18 Claims, 12 Drawing Sheets

FINFET AND METHOD OF FORMING FIN OF THE FINFET

CROSS-REFERENCE TO RELATED APPLICATION

This U.S. non-provisional application claims priority under 35 U.S.C. § 119(a) to Korean Patent Application No. 10-2015-0161752, filed on Nov. 18, 2015, the contents of which are herein incorporated by reference in their entirety.

BACKGROUND

Some embodiments of the present inventive concepts relate to a method of generating a fin of a fin field-effect transistor (FinFET). More particularly, some embodiments of the present inventive concepts relate to a method of generating fins of a FinFET having different line widths on the same semiconductor substrate.

The FinFET is provided in order to decrease a size of a semiconductor device. A technology of forming a fine pattern is required to form a fin of the FinFET. For example, it is possible to form a fin of the FinFET using a double-patterning technology (DPT) which uses a spacer. The shape of a fin is generated to be steeper and taller in order to improve performance and gate control. As a result, a self-heating temperature of the fin may be increased, which increases the possibility of degradation in performance and reliability of the semiconductor device.

SUMMARY

According to an aspect of the present inventive concepts, there is provided a method of generating a fin of a FinFET, including depositing a first hard mask layer on a first dummy gate and a second dummy gate, generating first spacers on the first dummy gate and second spacers on the second dummy gate by etching the first hard mask layer, removing only the first spacers, after removing the first spacers, depositing a second hard mask layer on the first dummy gate and the second spacers, generating third spacers on the first dummy gate and fourth spacers on the second dummy gate by etching the second hard mask layer, removing the first dummy gate and the second dummy gate, and generating first fins using the third spacers and generating second fins using the second spacers and the fourth spacers.

In some embodiments, the line width of the second fins may be formed to be wider than the line width of the first fins. The first fins and the second fins may be generated on the same wafer.

In some embodiments, the removing of only the first spacers may include forming a blocking mask surrounding the second dummy gate including the second spacers, exposing the first dummy gate by removing the first spacers, and removing the blocking mask. The semiconductor substrate may be formed of at least one of silicon and a III-V compound semiconductor.

In some embodiments, the first hard mask layer and the second hard mask layer may be formed using at least one of silicon nitride and photo-resist. The first dummy gate and the second dummy gate may be formed by etching at least one of a polysilicon layer and a spin on hardmask (SOH) layer. The blocking mask may be formed using at least one of a photo-resist, SiO2, and anti-reflection coating (ARC).

In some embodiments, each of the first fins and the second fins may be used as the channel of one of an nMOSFET and a pMOSFET. The first fins may form an nMOSFET channel and the second fins may form a pMOSFET channel.

In some embodiments, the method of generating a fin of a FinFET may further include removing only the third spacers, after removing the third spacers, depositing a third hard mask layer on the first dummy gate and the fourth spacer, generating fifth spacers of the first dummy gate and sixth spacers of the second dummy gate by etching the third hard mask layer, generating first fins using the fifth spacer, and generating second fins using the second spacer, the fourth spacer, and the sixth spacer. A FinFET according to exemplary embodiments of the present inventive concepts may be generated according to the method of generating a fin of a FinFET described above.

According to another aspect of the present inventive concepts, there is provided a method of generating a fin of a FinFET including generating a first dummy gate on a first region of a semiconductor substrate and a second dummy gate on a second region of the semiconductor substrate, depositing a first hard mask layer on or above the first dummy gate and the second dummy gate, generating first spacers on the first dummy gate and second spacers on the second dummy gate by etching the first hard mask layer, removing the first spacers on the first dummy gate, depositing a second hard mask layer on or above the first dummy gate, the second dummy gate and the second spacers, generating third spacers on the first dummy gate and fourth spacers on the second dummy gate by etching the second hard mask layer, removing the first dummy gate and the second dummy gate, and generating first fins on the first region using the third spacers and generating second fins on the second region using the second spacers and the fourth spacers.

In some embodiments, the line width of the second fins is wider than the line width of the first fins. In some embodiments, the first fins and the second fins are generated on the same wafer.

In some embodiments, the removing the first spacers includes forming a blocking mask surrounding the second dummy gate including the second spacers, exposing the first dummy gate by removing the first spacers, and removing the blocking mask.

In some embodiments, the method further includes removing the third spacers, after removing the third spacers, depositing a third hard mask layer on or above the first dummy gate, the second dummy gate and the fourth spacer, generating fifth spacers of the first dummy gate and sixth spacers of the second dummy gate by etching the third hard mask layer, and generating first fins using the fifth spacer and generating second fins using the second spacer, the fourth spacer, and the sixth spacer.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1:
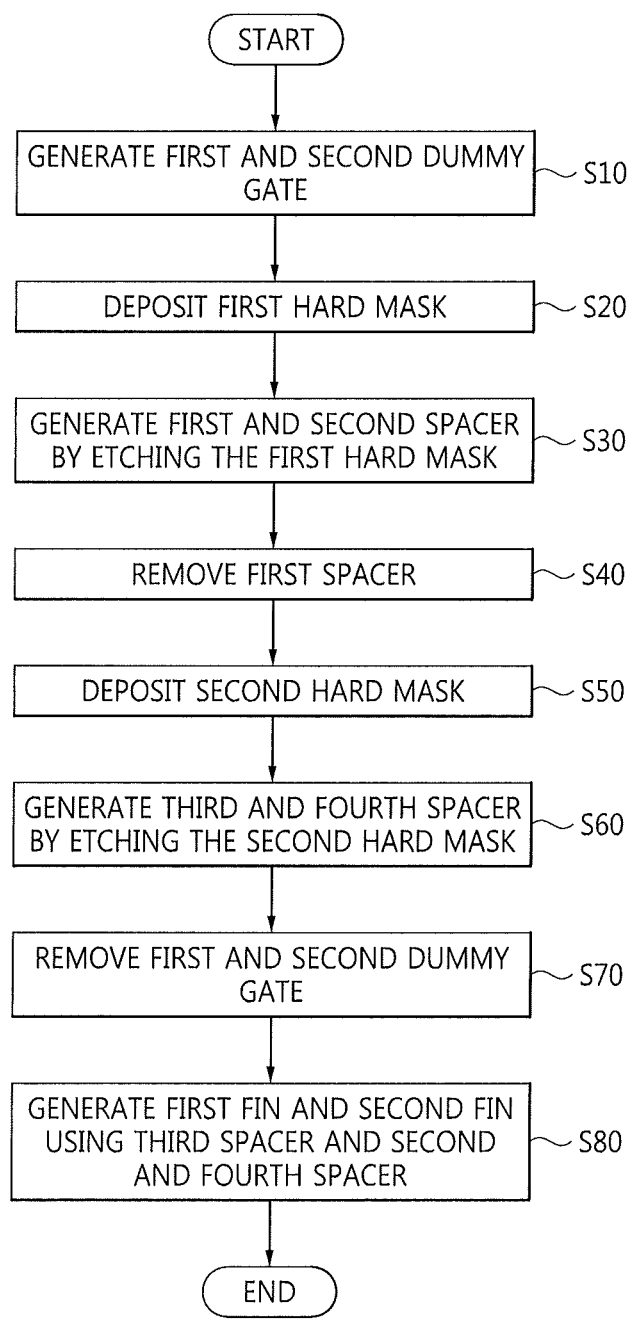
FIG. 1 is a flowchart illustrating a method of generating a fin of a FinFET according to some example embodiments of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
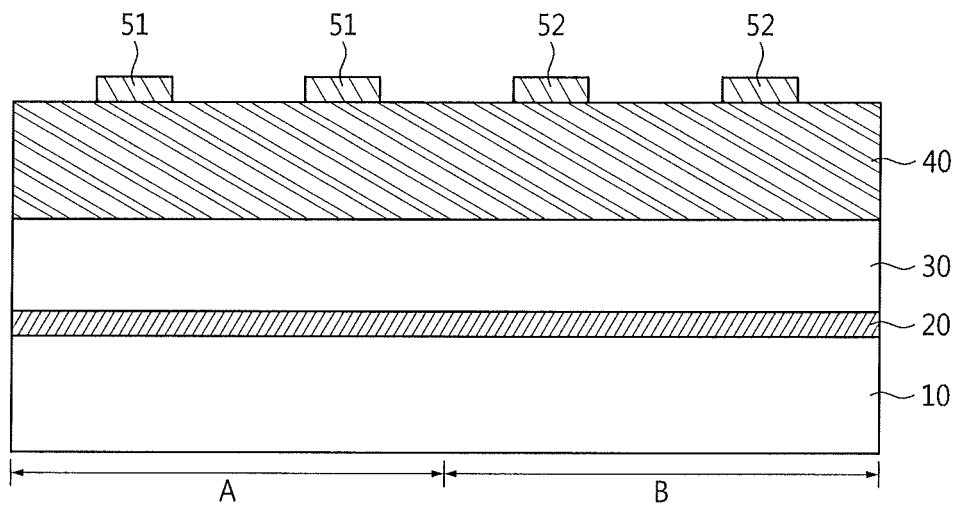
FIGS. 2 through 16 are cross-sectional views illustrating the method of generating a fin of a FinFET according to some example embodiments of the present inventive concepts.
Figure 3:
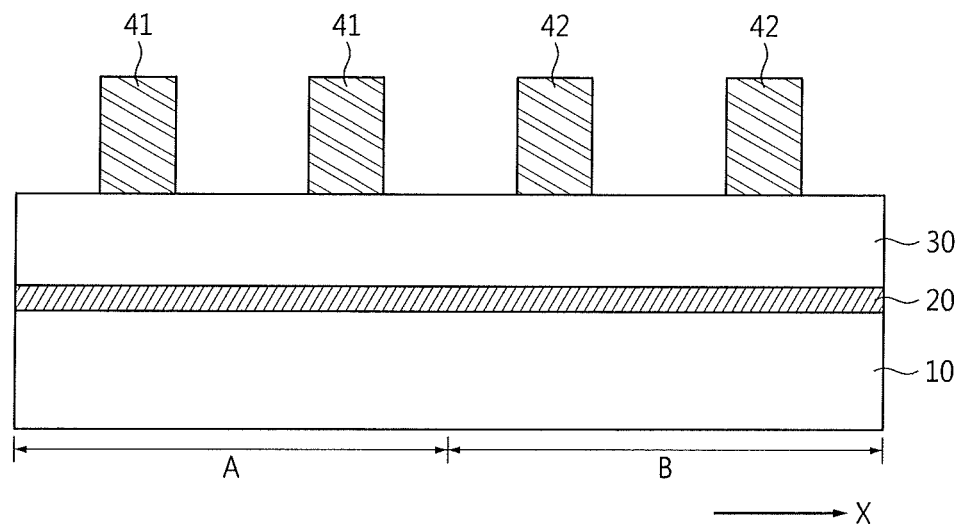

FIG. 1 is a flowchart illustrating a method of generating a fin of a FinFET according to some example embodiments of the present inventive concepts, and FIGS. 2 through 16 are cross-sectional views illustrating the method of generating a fin of a FinFET according to some example embodiments of the present inventive concepts. Referring to FIGS. 1 through 3, a first dummy gate 41 and a second dummy gate 42 may be generated on or above a semiconductor substrate 10 (S10).

Referring to FIG. 2, a protection film 20, an interlayer film 30, and a sacrifice layer 40 may be sequentially deposited on or above the semiconductor substrate 10. A first etching mask pattern 51 and a second etching mask pattern 52 may be formed on the sacrificial layer 40.

The semiconductor substrate 10 may be a substrate formed of, for example, silicon (Si) or a III-V compound, for example, gallium nitrogen (GaN), gallium arsenide (GaAs), indium phosphide (InP), or indium antimony (INSb); however, the semiconductor substrate 10 is not limited thereto. The semiconductor substrate 10 may include a first region A and a second region B. The first region A may be defined as a region in which first fins 11a and 11b, as illustrated in FIG.

Figure 17:
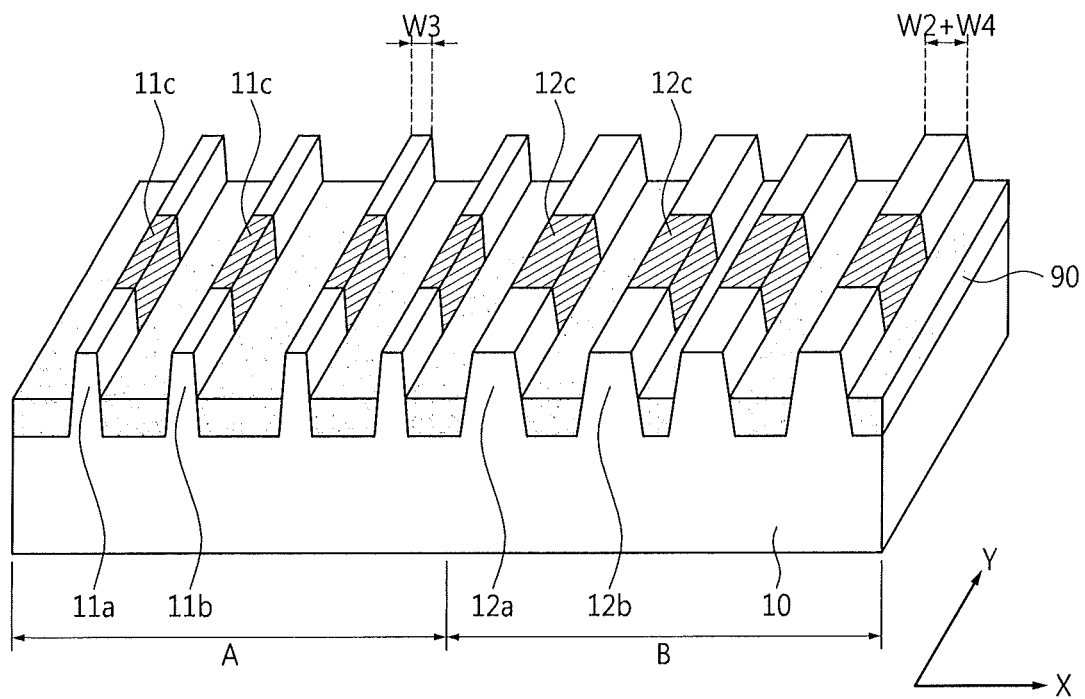
FIG. 17 is a perspective view of a FinFET formed according to the method of generating a fin of a FinFET of FIG. 1.

17, to be described hereinafter are formed, and the second region B may be defined as a region in which second fins 12a and 12b, as illustrated in FIG. 17, to be described hereinafter are formed.

The protection film 20 may be, for example, an oxide film, for example, $SiO_2$, or a nitride film, for example, $Si_3N_4$; however, is the protection film 20 is not limited thereto. The protection film 20 may protect the semiconductor substrate 10 in a manufacturing process of a semiconductor device. The protection film 20 may be patterned, in a process to be described hereinafter, and used as an etching mask for etching the semiconductor substrate 10.

The interlayer film 30 may be, for example, a spin on hardmask (SOH) or a nitride film, for example, SiN; however, the interlayer film 30 is not limited thereto. The interlayer film 30 may be patterned, in a process to be described hereinafter, and used as an etching mask for etching the semiconductor substrate 10 along with the protection film 20.

The sacrifice layer 40 may be used to form the first and second dummy gates 41 and 42. The sacrifice layer 40 may be, for example, a poly-silicon (Poly-Si) film or a SOH; however, the sacrifice layer 40 is not limited thereto. The sacrifice layer 40 may be formed using, for example, a spin coating process or a bake process. More specifically, an organic compound layer may be formed on the interlayer film 30 by the spin coating process, and the sacrifice layer 40 may be formed by curing the organic compound layer by the bake process.

Referring to FIGS. 2 and 3, the sacrifice layer 40 formed on or above the interlayer film 30 may be etched and the first and second dummy gates 41 and 42 may be formed on or above the interlayer film 30. Each of the first dummy gate 41 and the second dummy gate 42 is extended in a first direction, for example, a Y-axis direction Y (as illustrated in FIG. 17), and may be formed to be separated from each other in a second direction, for example, an X-axis direction X (as illustrated in FIGS. 3 and 17).

The first dummy gate 41 may be formed on or above a first region A of the semiconductor substrate 10 and the second dummy gate 42 may be formed on or above a second region B of the semiconductor substrate 10. Each of the first dummy gate 41 and the second dummy gate 42 may refer to a plurality of dummy gates. Each of the first dummy gate 41 and the second dummy gate 42 may be formed using each of the first etching mask film pattern 51 and the second etching mask film pattern 52, respectively, formed on or above the sacrifice film 40.

The first etching mask film pattern 51 and the second etching mask film pattern 52 may be, for example, an oxynitride film (SiON) pattern; however, the first etching mask film pattern 51 and the second etching mask film pattern 52 are not limited thereto. The first etching mask film pattern 51 and the second etching mask film pattern 52 may be used as etching masks for etching the sacrifice layer 40. As a result, the first etching mask film pattern 51 and the second etching mask film pattern 52 may be formed of a material having a different selectivity from the selectivity of the sacrifice layer 40, respectively.

Figure 4:
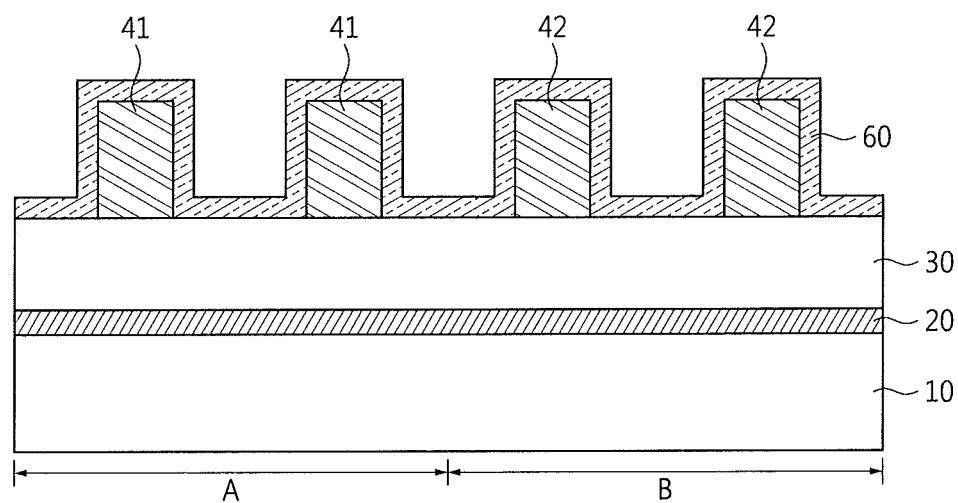

Referring to FIGS. 1 and 4, a first hard mask film 60 may be deposited on or above the first dummy gate 41 and the second dummy gate 42 (S20). Specifically, the first hard mask film 60 may be deposited on or above the semiconductor substrate 10 to cover the exposed portions of the upper surface of the interlayer film 30, side surfaces and the upper surface of the first dummy gate 41 and side surfaces and the upper surface of the second dummy gate 42.

The first hard mask film 60 may include, for example, silicon nitride, for example, $Si_3N_4$; however, the first hard mask film 60 is not limited thereto. Moreover, the first hard mask film 60 may be deposited using, for example, a chemical vapor deposition (CVD), a physical vapor deposition (PVD), or an atomic layer deposition; however, the present inventive concepts are not limited thereto.

The first hard mask film 60 may be formed having a uniform thickness with respect to all contact surfaces. In particular, thicknesses of the first hard mask film 60 formed on both sides of each of the first dummy gate 41 and the second dummy gate 42 may be the same as each other.

Figure 5:
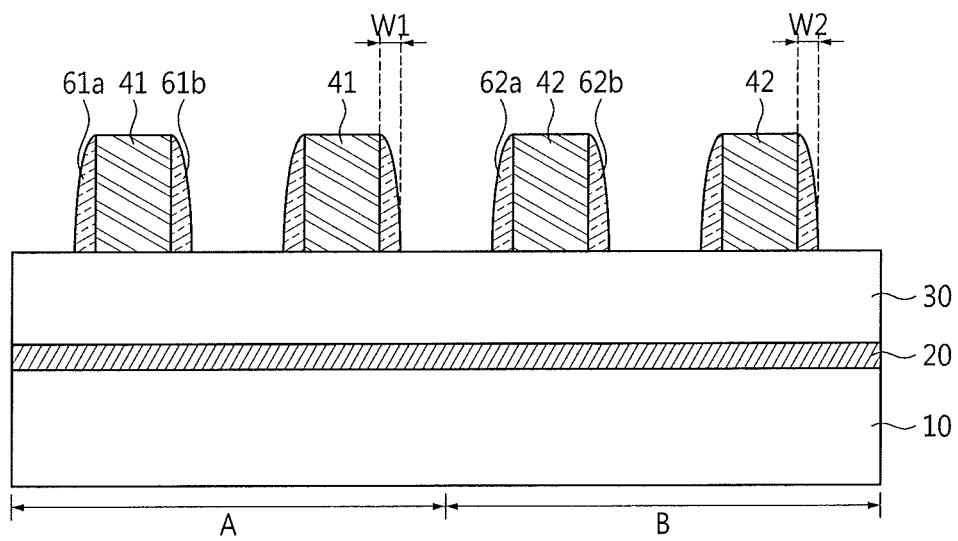

Referring to FIGS. 1 and 5, first spacers 61a and 61b on the first dummy gate 41 and second spacers 62a and 62b on the second dummy gate 42 may be generated by etching the first hard mask film 60 (S30). Specifically, the first spacer 61a may be formed on one side of the first dummy gate 41, and the first spacer 61b may be formed on the other side of the first dummy gate 41. That is, two first spacers 61a and 61b may be formed on both sides of the first dummy gate 41.

In addition, the second spacer 62a may be formed on one side of the second dummy gate 42, and the second spacer 62b may be formed on the other side of the second dummy gate 42. That is, two second spacers 62a and 62b may be formed on both sides of the second dummy gate 42.

The first spacers 61a and 61b and the second spacers 62a and 62b may be formed by partially etching the first hard mask film 60, such that portions of the first hard mask film 60 remain on both side surfaces of the first dummy gate 41 and the second dummy gate 42. For example, the first spacers 61a and 61b and the second spacers 62a and 62b may be etched using, for example, a dry etching, for example, etch-back or blanket, process.

The first spacers 61a and 61b may be formed on or above the first region A of the semiconductor substrate 10, and the second spacers 62a and 62b may be formed on or above the second region B of the semiconductor substrate 10.

The line width, for example, W1, of the first spacers 61a and 61b may be the same as the line width, for example, W2, of the second spacers 62a and 62b. The line width of first and second spacers 61a, 61b and 62a, 62b may be defined as a line width measured at the lowest point of each spacer. A line width of the first spacers 61a and 61b and the second spacers 62a and 62b may decrease from a lowest point to a highest point of each spacer.

Figure 6:
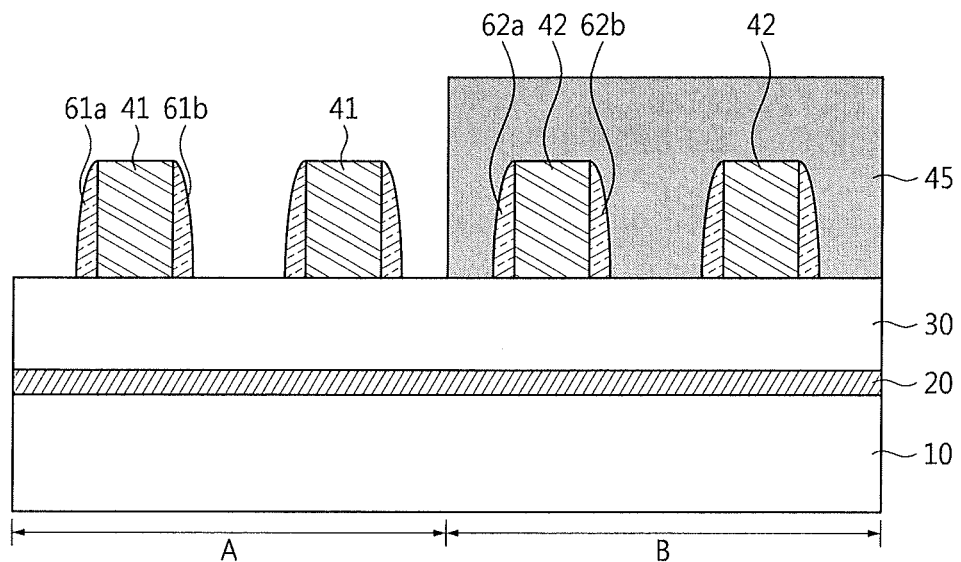

Referring to FIGS. 1 and 6 through 8, the first spacers 61a and 61b formed on both sides of the first dummy gate 41 may be removed (S40). Referring to FIG. 6, a blocking mask 45 may be used to remove the first spacers 61a and 61b. The blocking mask 45 may be formed to surround the second dummy gate 42 including the second spacers 62a and 62b. That is, the blocking mask 45 may be formed on or above the second region B of the semiconductor substrate. That is, the blocked mask 45 may cover the interlayer film 30, the second spacers 62a and 62b and the second dummy gate 42 in the second region B. The blocking mask 45 may be, for example, a photo-resist (PR) block, SiO2, anti-reflection coating (ARC), or an amorphous carbon block.

Figure 7:
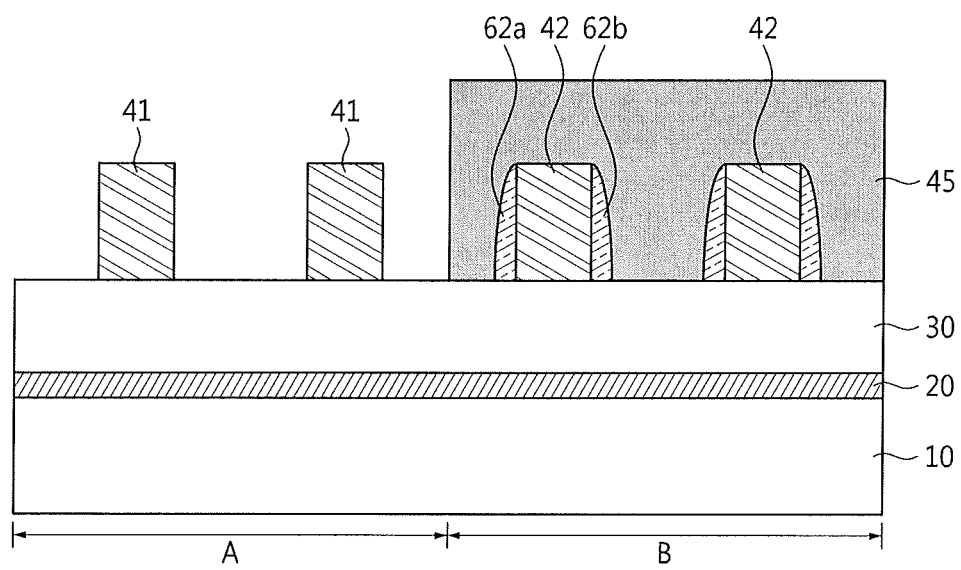

Referring to FIG. 7, after the blocking mask 45 is formed on or above the second region B of the semiconductor substrate 10, the first spacers 61a and 61b formed on both sides of the first dummy gate 41 may be etched by, for example, a wet etching process, resulting in both side surfaces of the first dummy gate 41 being exposed. At this time, the second spacers 62a and 62b formed on both sides of the second dummy gate 42 are covered by the blocking mask 45. As a result, only the first spacers 61a and 61b may be etched and removed by the wet etching process, and the second spacers 62a and 62b may remain without being etched.

Figure 8:
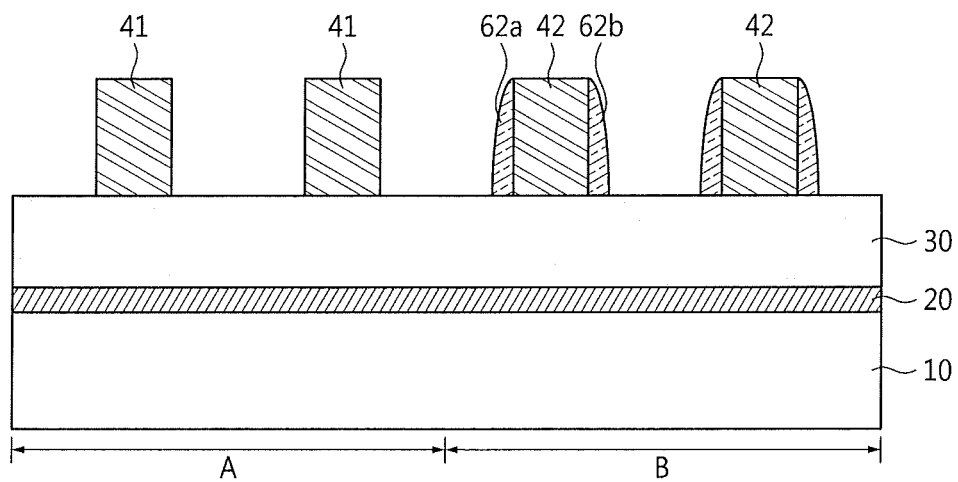

Referring to FIG. 8, after the first spacers 61a and 61b are removed, the blocking mask 45 may be removed using, for example, a PR stripe or an ashing process. As a result, only the second spacers 62a and 62b among the first spacers 61a and 61b and the second spacers 62a and 62b, which are formed by the first hard mask film 60, remain on or above the interlayer film 30.

Figure 9:
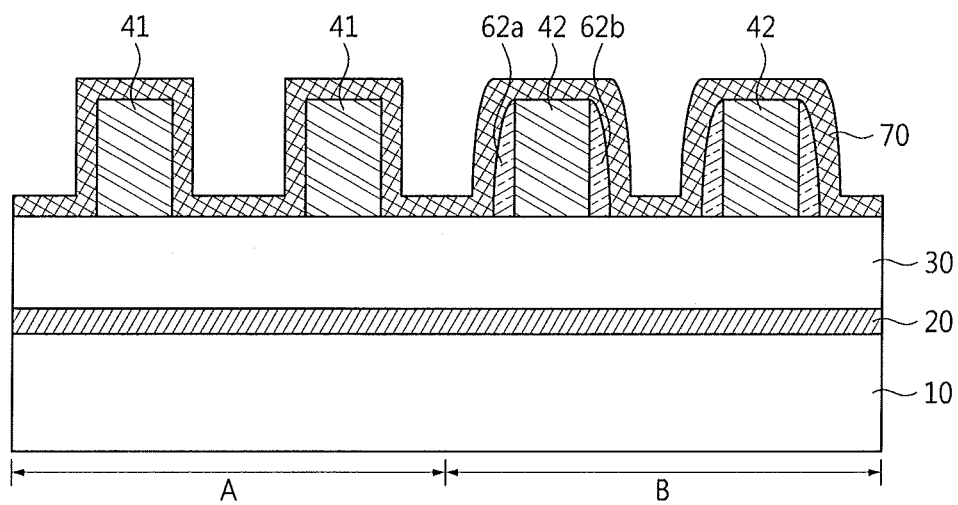

Referring to FIGS. 1 and 9, after removing the first spacers 61a and 61b, a second hard mask film 70 may be deposited on or above the first dummy gate 41, the second spacers 62a and 62b and the second dummy gate 42 (S50). Specifically, the second hard mask film 70 may be deposited on or above the semiconductor substrate 10 to cover the exposed portions of the upper surface of the interlayer film 30, side surfaces and the upper surface of the first dummy gate 41, the upper surface of the second dummy gate 42, and the side surfaces of the second spacers 62a and 62b.

The second hard mask film 70 may be formed of, for example, the same material as the first hard mask film 60. That is, the second hard mask film 70 may include, for example, silicon nitride, for example, $Si_3N_4$; however, the second hard mask film 70 is not limited thereto. Moreover, the second hard mask film 70 may be deposited using, for example, the chemical vapor deposition, the physical vapor deposition, or the atomic layer deposition.

The second hard mask film 70 may be formed having a uniform thickness with respect to all contact surfaces. In particular, thicknesses of the second hard mask film 70 formed on both sides of each of the first dummy gate 41 and the second dummy gate 42 may be the same as each other.

Figure 10:
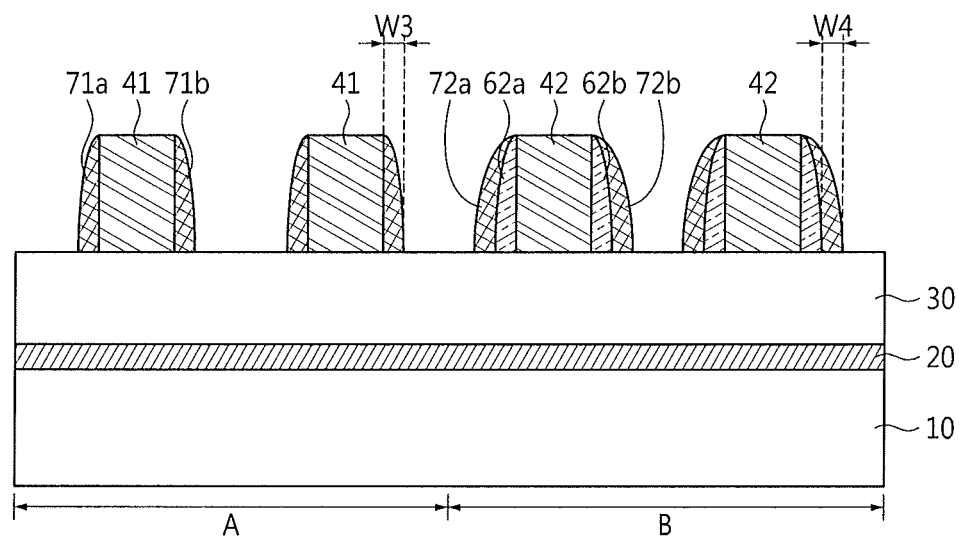

Referring to FIGS. 1 and 10, third spacers 71a and 71b on the sidewalls of the first dummy gate 41 and fourth spacers 72a and 72b on the sidewalls of the second dummy gate 42 may be generated by etching the second hard mask film 70 (S60). Specifically, the third spacer 71a may be formed on one side of the first dummy gate 41 and the third spacer 71b may be formed on the other side of the first dummy gate 41. That is, two third spacers 71a and 71b may be formed on both sides of the first dummy gate 41.

Moreover, the fourth spacer 72a may be formed on the side surface of the second spacer 62a formed on one side of the second dummy gate 42 and the fourth spacer 72b may be formed on the side surface of the second spacer 62b formed on the other side of the second dummy gate 42. That is, two fourth spacers 72a and 72b may be additionally formed on both sides of the second dummy gate 42.

The third spacers 71a and 71b and the fourth spacers 72a and 72b may be formed by partially etching the second hard mask film 70 such that portions of the second hard mask film 70 remain on both side surfaces of the first dummy gate 41 and on the side surfaces of each of the second spacers 62a and 62b. That is, the first dummy gate 41 may have the third spacers 71a and 71b formed on side surfaces thereof and the second dummy gate 42 may have the second spacers 62a and 62b and the fourth spacers 72a and 72b formed on side surfaces thereof. For example, the third spacers 71a and 71b and the fourth spacers 72a and 72b may be formed using, for example, the dry etching, for example, etch-back or blanket, process.

The third spacers 71a and 71b may be formed on or above the first region A of the semiconductor substrate 10, and the fourth spacers 72a and 72b may be formed on or above second region B of the semiconductor substrate 10.

The line width, for example, W3, of the third spacers 71a and 71b may be substantially the same as the line width, for example, W4, of the fourth spacers 72a and 72b. The line width of third and fourth spacers 71a, 71b and 72a, 72b may be defined as a line width measured at the lowest point of each spacer. A line width of the third spacers 71a and 71b and the fourth spacers 72a and 72b may decrease from a lowest point to a highest point of each spacer.

Figure 11:
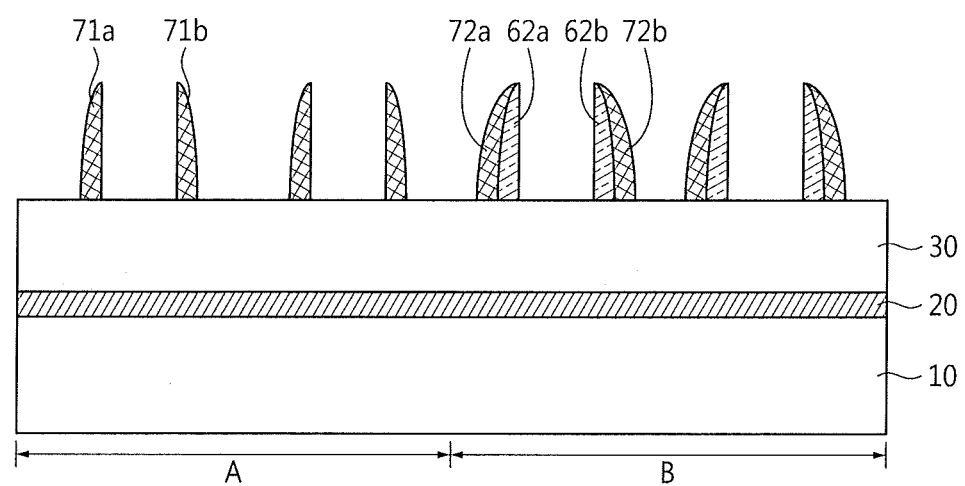

Referring to FIGS. 1 and 11, the first dummy gate 41 and the second dummy gate 42 may be removed (S70). For example, dry etching and wet etching may be used to remove the first dummy gate 41 and the second dummy gate 42.

By removing the first dummy gate 41 and the second dummy gate 42, the third spacers 71a and 71b remain in the first region A of the semiconductor substrate 10, and the second spacers 62a and 62b and the fourth spacers 72a and 72b remain in the second region B of the semiconductor substrate 10. That is, an opening may be formed between the third spacers 71a and 71b and an opening may be formed between the second spacers 62a and 62b.

Referring to FIGS. 1 and 11 through 13, the first fins 11a and 11b and the second fins 12a and 12b may be generated in the semiconductor substrate 10 using the second spacers 62a and 62b, the third spacers 71a and 71b, and the fourth spacers 72a and 72b (S80).

Figure 12:
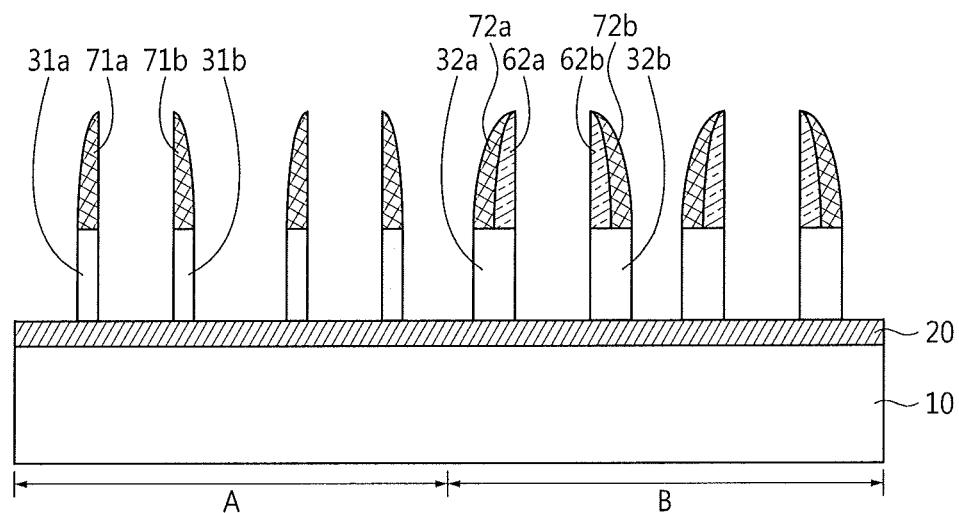

Referring to FIG. 12, the interlayer film 30 may be etched. As a result, first interlayer film patterns 31a and 31b and second interlayer film patterns 32a and 32b may be formed. For example, the interlayer film 30 may be etched using, for example, a dry etching process, and the second spacers 62a and 62b, the third spacers 71a and 71b, and the fourth spacers 72a and 72b may be used as an etching mask in the process. As a result, the first interlayer film pattern 31a may be formed below a third spacer 71a, and the first interlayer film pattern 31b may be formed below the third spacer 71b. Moreover, the second interlayer film pattern 32a may be formed below the second spacer 62a and the fourth spacer 72a, and the second interlayer film pattern 32b may be formed below the second spacer 62b and the fourth spacer 72b.

Figure 13:
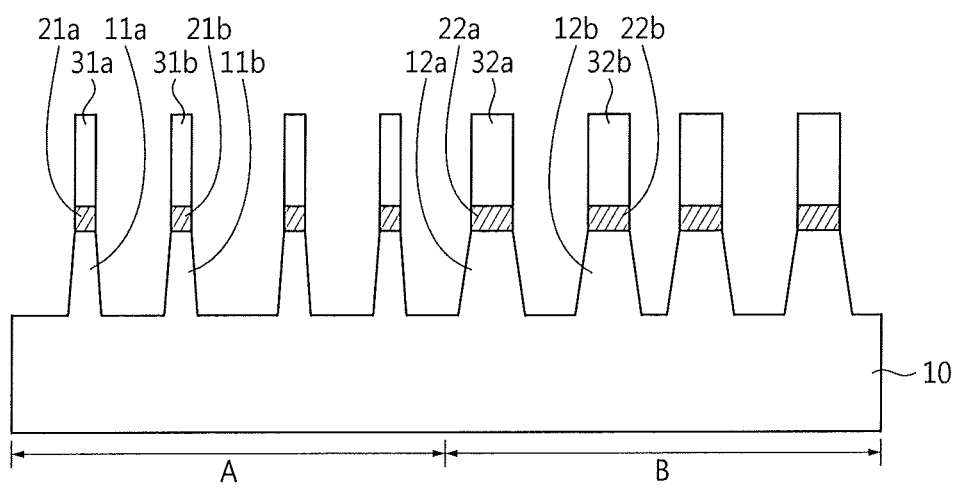
Figure 14:
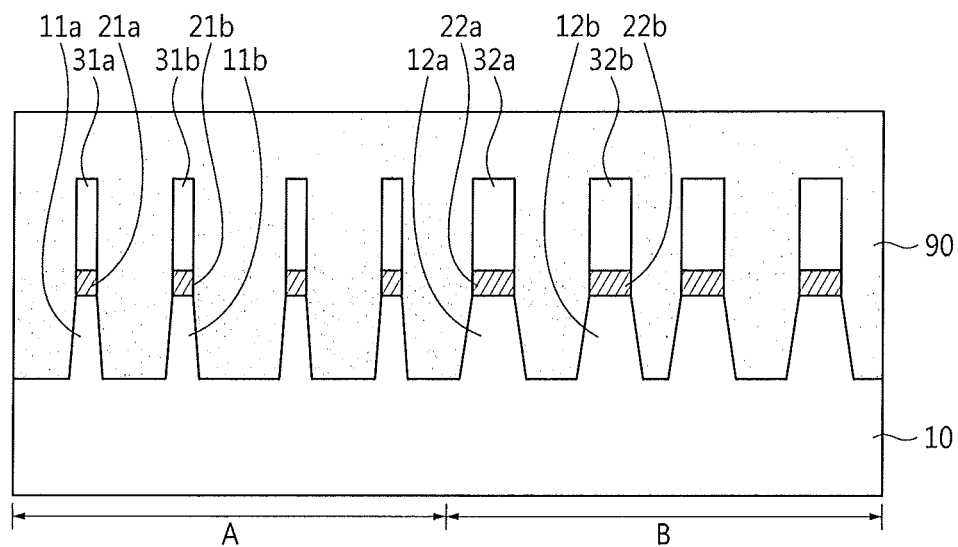

Referring to FIG. 13, after the first interlayer film patterns 31a and 31b and the second interlayer film patterns 32a and 32b are formed, the second spacers 62a and 62b, the third spacers 71a and 71b, and the fourth spacers 72a and 72b may be removed using, for example, a wet etching process. The protection film 20 may be etched using the first interlayer film patterns 31a and 31b, and the second interlayer film patterns 32a and 32b as an etching mask. As a result, first protection film patterns 21a and 21b and second protection film patterns 22a and 22b may be formed.

For example, the first protection film pattern 21a may be formed below the first interlayer film pattern 31a, and the first protection film pattern 21b may be formed below the first interlayer film pattern 31b. In addition, the second protection film pattern 22a may be formed below the second interlayer film pattern 32a and the second protection film pattern 22b may be formed below the second interlayer film pattern 32b.

The semiconductor substrate 10 may be etched using the first interlayer film patterns 31a and 31b, the second interlayer film patterns 32a and 32b, the first protection film patterns 21a and 21b, and the second protection film patterns 22a and 22b as an etching mask. As a result, first fins 11a and 11b and second fins 12a and 12b may be formed on the semiconductor substrate 10. For example, the first fin 11a may be formed below the first protection film pattern 21a and the first fin 11b may be formed below the first protection film pattern 21b. In addition, the second fin 12a may be formed below the second protection film pattern 22a and the second fin 12b may be formed below the second protection film pattern 22b. The first fins 11a and 11b may be formed on or above the first region A of the semiconductor substrate 10, and the second fins 12a and 12b may be formed on or above the second region B of the semiconductor substrate 10.

Referring to FIGS. 1, and 14 through 16, an oxide film 90 may be formed on or above the semiconductor substrate 10. The oxide film 90 may be deposited to completely cover the first finsins 11a and 11b, the second fins 12a and 12b, the first protection film patterns 21a and 21b, the second protection film patterns 22a and 22b, the first interlayer film patterns 31a and 31b, and the second interlayer film patterns 32a and 32b. That is, the oxide film 90 may cover exposed surfaces of the semiconductor substrate 10, side surfaces of the first fins 11a and 11b, side surfaces of the second fins 12a and 12b, side surfaces of the first protection film patterns 21a and 21b, side surfaces of the second protection film patterns 22a and 22b, side surfaces and an upper surface of the first interlayer film patterns 31a and 31b, and side surfaces and an upper surface of the second interlayer film patterns 32a and 32b.

Figure 15:
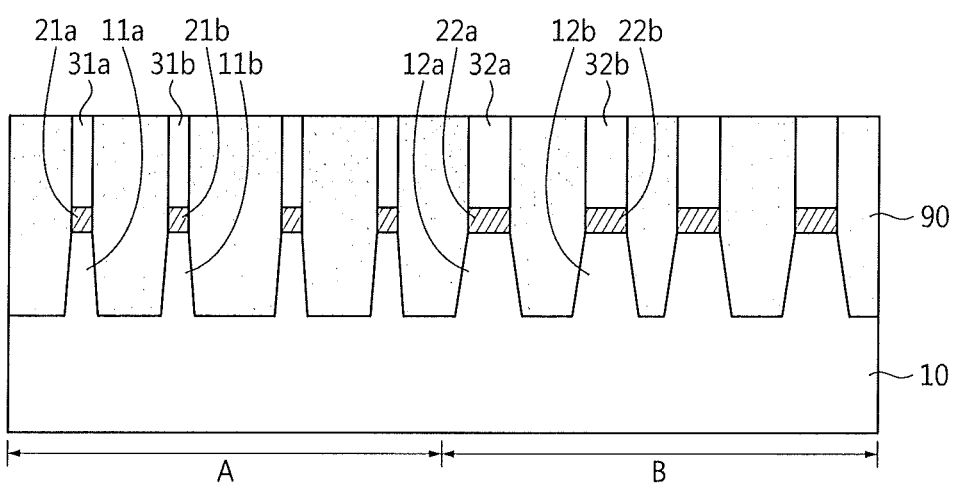
Figure 16:
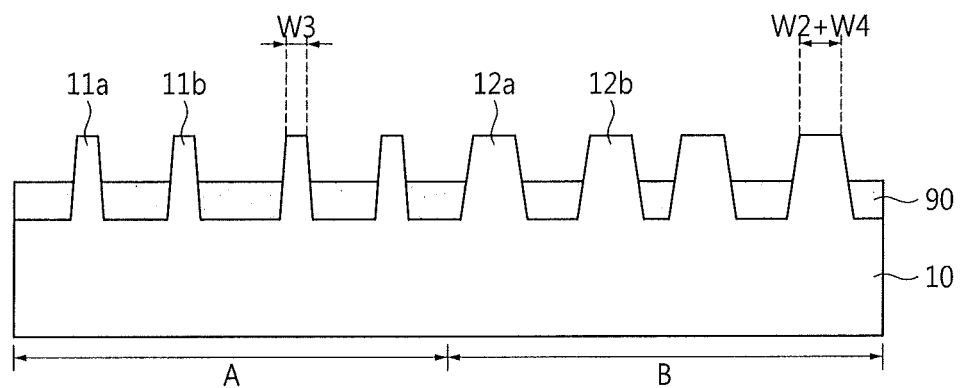

The oxide film 90 may be flattened using, for example, a chemical mechanical polishing (CMP) process. The CMP process may proceed until the upper surfaces of the first interlayer film patterns 31a and 31b and the second interlayer film patterns 32a and 32b are exposed, as illustrated in FIG. 15.

After the CMP process is performed exposing the upper surfaces of the first interlayer film patterns 31a and 31b and the second interlayer film patterns 32a and 32b, the first protection film patterns 21a and 21b, the second protection film patterns 22a and 22b, the first interlayer film patterns 31a and 31b, and the second interlayer film patterns 32a and 32b are removed, and thereby the first fins 11a and 11b and the second fins 12a and 12b formed on the semiconductor substrate 10 may be exposed.

The line width of the first fins 11a and 11b, for example, W3, may be different from the line width of the second fins 12a and 12b, for example W2+W4. The line width of the first fins 11a and 11b and the second fins 12a and 12b may be defined as a line width measured at the highest point of each fin. For example, the line width of the first fins 11a and 11b may be the same as the line width, for example, W3, of the third spacers 71a and 71b. The line width of the second fins 12a and 12b may be the same as a sum, for example, W2+W4, of the line width, for example, W2, of the second spacers 62a and 62b and the line width, for example, W4, of the fourth spacers 72a and 72b.

The first spacers 61a and 61b and the second spacers 62a and 62b are formed from the first hard mask film 60, such that they may have the same line width, for example, W1 (=W2). Moreover, the third spacers 71a and 71b and the fourth spacers 72a and 72b are formed from the second hard mask film 70, such that they may have the same line width, for example, W3 (=W4). Therefore, the line width, for example, W2+W4, of the second fins 12a and 12b may be formed to be wider than the line width, for example, W3, of the first fins 11a and 11b.

FIG. 17 is a perspective view of a FinFET formed according to the method of generating a fin of a FinFET of FIG. 1.

Referring to FIG. 17, the first fins 11a and 11b may be formed on or above the first region A of the semiconductor substrate 10, and the second fins 12a and 12b may be formed on or above the second region B of the semiconductor substrate 10. The line width of the second fins 12a and 12b may be formed to be wider than the line width, for example, W3, of the first fins 11a and 11b. That is, the first fins and the second fins having different line widths may be formed on the same wafer. That is, a narrow fin, for example, the first fins 11a and 11b, is formed in the first region A of the semiconductor substrate 10 and a wide fin, for example, the second fins 12a and 12b, is formed in the second region B of the semiconductor substrate 10.

Each of the first fins 11a and 11b may include a first channel region 11c and each of the second fins 12a and 12b may include a second channel region 12c, Gates (or a common gate) may be formed on or above the first channel region 11c and the second channel region 12c, and, accordingly, a FinFET having channel regions with different line widths may be provided. The first channel region 11c and the second channel region 12c may be used as the channel of one of an nMOSFET and a pMOSFET. According to some embodiments, the first channel region 11c and the second channel region 12c may be used as the channel of nMOSFET or the channel of pMOSFET.

According to some embodiments, the first channel region 11c may be used as the channel of an nMOSFET, and the second channel region 12c may be used as the channel of a pMOSFET. Alternatively, the first channel region 11c may be used as the channel of a pMOSFET and the second channel region 12c may be used as the channel of an nMOSFET.

In general, the line width of a fin may be related to self-heating temperature in a channel. That is, heat formed in a channel may be discharged to the outside mostly through the semiconductor substrate 10. As a result, heat discharge may not be smoothly performed as the line width of a fin becomes narrower. In particular, a pMOSFET mainly uses a source and a drain of silicon germanium (SiGe) which has a low thermal conductivity, and has relatively poor heat discharge characteristics compared to an nMOSFET. Therefore, a pMOSFET having a fin with a narrow width may have issues with performance and reliability.

In order to solve such a problem, as in the example embodiments of the present inventive concepts described above, the first channel region 11c having a narrow line width is used as the channel of an nMOSFET, and the second channel region 12c having a wide line width may be used as the channel of a pMOSFET. That is the nMOSFET may be provided with a narrow fin and the pMOSFET may be provided with a wide fin.

Figure 18:
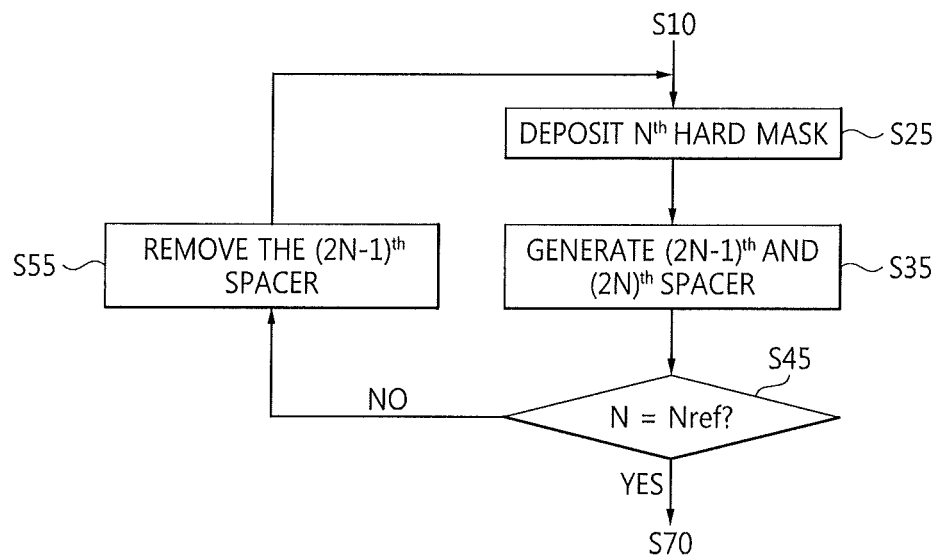
FIG. 18 is a flowchart illustrating a method of generating a fin of a FinFET according to some example embodiments of the present inventive concepts.

FIG. 18 is a flowchart illustrating a method of generating a fin of a FinFET according to some example embodiments of the present inventive concepts, and FIGS. 19 through 22 are cross-sectional views illustrating the method of generating a fin of a FinFET according to some example embodiments of the present inventive concepts.

Figure 19:
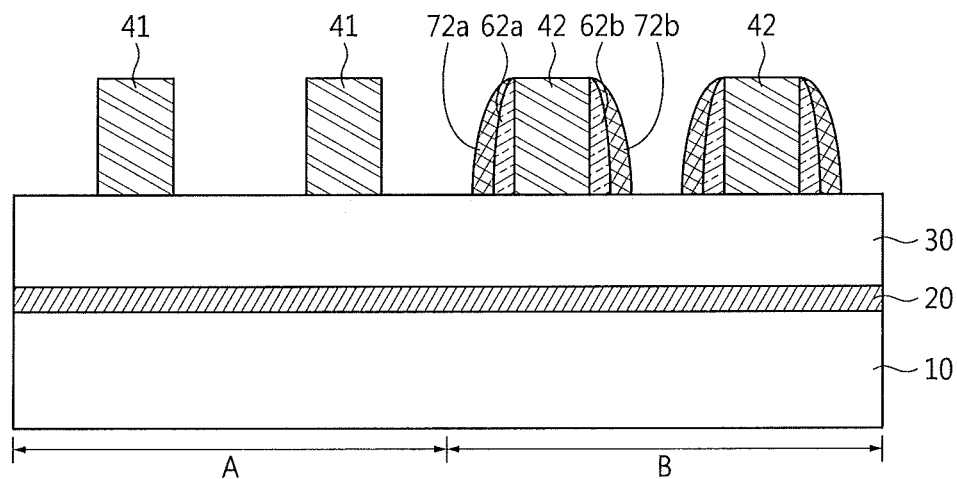
FIGS. 19 through 22 are cross-sectional views illustrating the method of generating a fin of a FinFET according to some example embodiments of the present inventive concepts.
Figure 20:
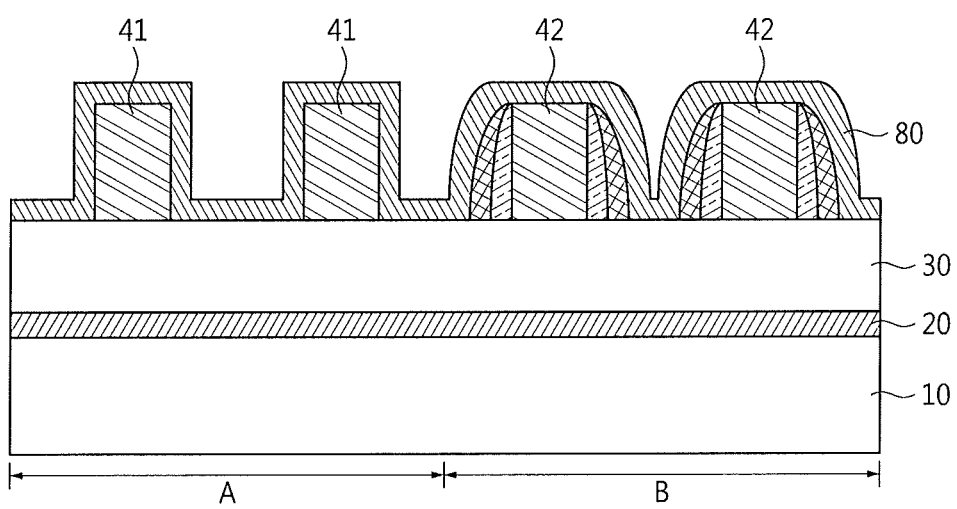

Referring to FIGS. 1, 18, and 19, after the third spacers 71a and 71b of the first dummy gate 41 and the fourth spacers 72a and 72b of the second dummy gate 42 are generated (S60), the third spacers 71a and 71b formed on both sides of the first dummy gate 41 may be removed (S55). That is, the $(2N-1)^{th}$ spacer is removed (S55). The removal of the third spacers 71a and 71b may be performed using a method substantially the same as the method described in FIGS. 6 through 8. Referring to FIGS. 18 and 20, a third hard mask film 80 may be deposited on or above the first dummy gate 41, the fourth spacers 72a and 72b and the second dummy gate 42 (S25). That is, a $N^{th}$ hard mask is deposited (S25).

More specifically, the third hard mask film 80 may be deposited on or above the semiconductor substrate 10 to cover exposed portions of the upper surface of the interlayer film 30, side surfaces and the upper surface of the first dummy gate 41, the upper surface of the second dummy gate 42, and the side surface of the fourth spacers 72a and 72b.

Figure 21:
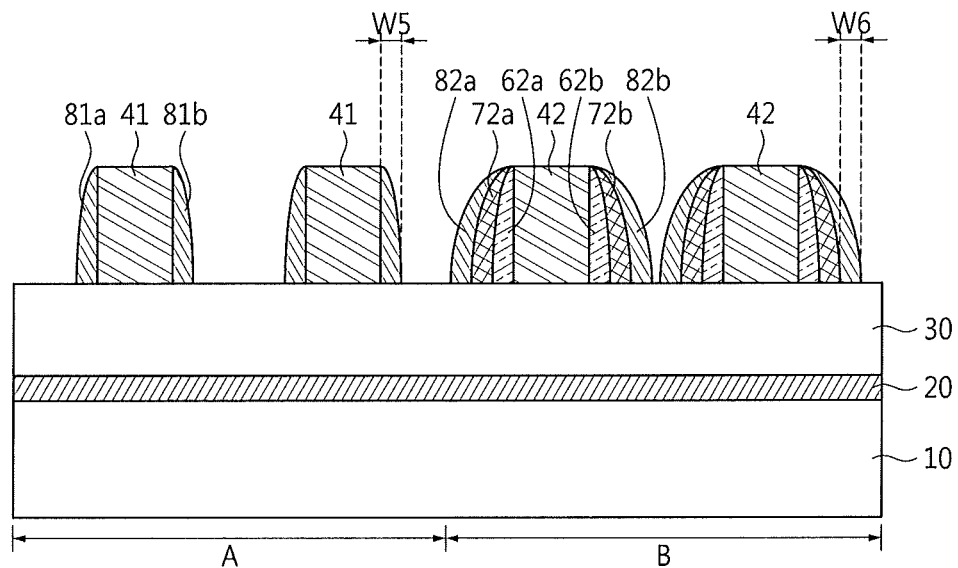

The third hard mask film 80 may be formed of, for example, the same material as the first hard mask film 60 and the second hard mask film 70. Moreover, the third hard mask film 80 may be deposited using, for example, the chemical vapor deposition, the physical vapor deposition, or the atomic layer deposition; however, the present inventive concepts are not limited thereto. Referring to FIGS. 18 and 21, fifth spacers 81a and 81b of the first dummy gate 41 and the sixth spacers 82a and 82b of the second dummy gate 42 may be generated by etching the third hard mask film 80 (S35). That is, $(2N-1)^{th}$ and $(2N)^{th}$ spacers are generated (S35).

Fifth spacers 81a and 81b on the sidewalls of the first dummy gate 41 and sixth spacers 82a and 82b on the sidewalls of the second dummy gate 42 may be generated by etching the third hard mask film 80. Specifically, the fifth spacer 81a may be formed on one side of the first dummy gate 41 and the third spacer 81b may be formed on the other side of the first dummy gate 41. That is, two third spacers 81a and 81b may be formed on both sides of the first dummy gate 41.

Moreover, the sixth spacer 82a may be formed on the side surface of the fourth spacer 72a formed on one side of the second dummy gate 42 and the sixth spacer 82b may be formed on the side surface of the fourth spacer 72b formed on the other side of the second dummy gate 42. That is, two sixth spacers 72a and 72b may be additionally formed on both sides of the second dummy gate 42.

The fifth spacers 81a and 81b and the sixth spacers 82a and 82b may be formed by partially etching the third hard mask film 80 such that portions of the third hard mask film 80 remain on both side surfaces of the first dummy gate 41 and on the side surfaces of each of the fourth spacers 72a and 72b. That is, the first dummy gate 41 may have the fifth spacers 81a and 81b formed on side surfaces thereof and the second dummy gate 42 may have the second spacers 62a and 62b, the fourth spacers 72a and 72b and the sixth spacers 82a and 82b formed on side surfaces thereof. For example, the fifth spacers 81a and 81b and the sixth spacers 82a and 82b may be formed using, for example, the dry etching, for example, etch-back or blanket, process.

The fifth spacers 81a and 81b may be formed on or above the first region A of the semiconductor substrate 10, and the sixth spacers 82a and 82b may be formed on or above the second region B of the semiconductor substrate 10.

The line width, for example, W5, of the fifth spacers 81a and 81b may be substantially the same as the line width, for example, W6, of the sixth spacers 82a and 82b. The line width of fifth and sixth spacers 81a, 81b and 82a, 82b may be defined as a line width measured at the lowest point of each spacer. A line width of the fifth spacers 81a and 81b and the sixth spacers 82a and 82b may decrease from a lowest point to a highest point of each spacer.

If the desired number of spacers have been provided, that is, if N=Nref in step (S45), the method proceeds to step (S70) of FIG. 1. If the desired number of spacers have not been provided, that is, if N is not equal to Nref in step (S45), the method returns to step (S55).

Figure 22:
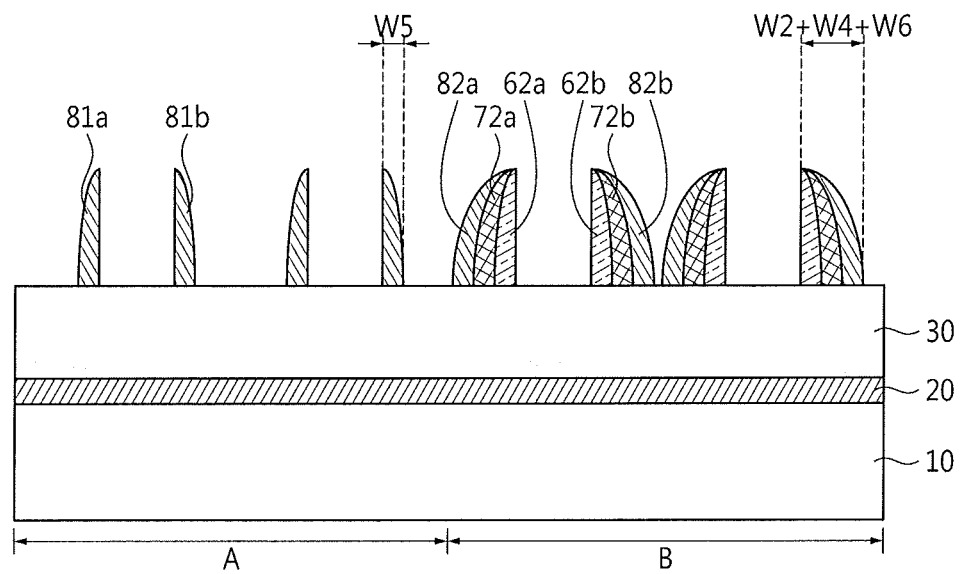

Referring to FIGS. 1, 18, and 22, if the number of desired number of spacers have been provided, that is, if N=Nref, the first dummy gate 41 and the second dummy gate 42 may be removed (S70). The first dummy gate 41 and the second dummy gate 42 are removed, such that fifth spacers 81a and 81b remain in the first region A of the semiconductor substrate 10, and the second spacers 62a and 62b, the fourth spacers 72a and 72b, and the sixth spacers 82a and 82b remain in the second region B of the semiconductor substrate 10. That is, an opening may be formed between the fifth spacers 81a and 81b and an opening may be formed between the second spacers 62a and 62b.

That is, a process of depositing a hard mask film, generating spacers from the hard mask film, and removing spacers formed on both sides of a first dummy gate may be repeated in the present inventive concepts. Accordingly, the line width of the second fins 12a and 12b generated in the second region B of the semiconductor substrate 10 may be determined. For example, when three hard mask films are deposited, the line width, for example, W2+W4+W6, of the second fins 12a and 12b may be three times wider than the line width W5 of the first fins 11a and 11b.

A method of generating a fin of a FinFET according to some example embodiments of the present inventive concepts may selectively use fins having different line widths depending on a device, thereby improving the performance and the reliability of the device.

While the present inventive concepts have been particularly shown and described with reference to example embodiments thereof, it will be understood that various changes in form and details may be made therein without departing from the spirit and scope of the following claims.

What is claimed is:

1. A method of generating a fin of a FinFET, comprising:
depositing a first hard mask layer on or above a first dummy gate and a second dummy gate;
generating first spacers on the first dummy gate and second spacers on the second dummy gate by etching the first hard mask layer;
removing only the first spacers of the first and second spacers;
after removing the first spacers, depositing a second hard mask layer on or above the first dummy gate and the second spacers;
generating third spacers on the first dummy gate and fourth spacers on the second dummy gate by etching the second hard mask layer;
removing the first dummy gate and the second dummy gate; and
generating first fins using the third spacers and generating second fins using the second spacers and the fourth spacers.

2. The method of claim 1, wherein a line width of the second fins is wider than a line width of the first fins.

3. The method of claim 1, wherein the first fins and the second fins are generated on a same wafer.

4. The method of claim 1, wherein the removing only the first spacers includes:
forming a blocking mask surrounding the second dummy gate including the second spacers;
exposing the first dummy gate by removing the first spacers; and
removing the blocking mask.

5. The method of claim 4, wherein the blocking mask is formed of at least one of a photo-resist, $SiO_2$, and anti-reflection coating (ARC).

6. The method of claim 1, wherein the first and second fins are formed of at least one of silicon and a III-V compound semiconductor.

7. The method of claim 1, wherein the first hard mask layer and the second hard mask layer are formed using at least one of silicon nitride ($Si_3N_4$) and photo-resist.

8. The method of claim 1, wherein the first dummy gate and the second dummy gate are formed by etching at least one of a polysilicon layer and a spin on hardmask (SOH) layer.

9. The method of claim 1, wherein the first fins and the second fins are used as a channel of one of an nMOSFET and a pMOSFET, respectively.

10. The method of claim 1, wherein the first fins form an nMOSFET channel, and the second fins form a pMOSFET channel.

11. The method of claim 1, further comprising:
removing only the third spacers;
after removing the third spacers, depositing a third hard mask layer on or above the first dummy gate and the fourth spacer;
generating fifth spacers of the first dummy gate and sixth spacers of the second dummy gate by etching the third hard mask layer; and
generating first fins using the fifth spacer and generating second fins using the second spacer, the fourth spacer, and the sixth spacer.

12. The method of claim 1, wherein the fourth spacers are formed on the second spacers.

13. The method of claim 1, wherein the fourth spacers contact the second spacers.

14. A FinFET generated according to the method of generating a fin of a FinFET of claim 1.

15. A method of generating a fin of a FinFET, comprising:
generating a first dummy gate on a first region of a semiconductor substrate and a second dummy gate on a second region of the semiconductor substrate;
depositing a first hard mask layer on or above the first dummy gate and the second dummy gate;
generating first spacers on the first dummy gate and second spacers on the second dummy gate by etching the first hard mask layer;
removing the first spacers on the first dummy gate;
depositing a second hard mask layer on or above the first dummy gate, the second dummy gate and the second spacers;
generating third spacers on the first dummy gate and fourth spacers on the second dummy gate by etching the second hard mask layer;
removing the first dummy gate and the second dummy gate; and
generating first fins on the first region using the third spacers and generating second fins on the second region using the second spacers and the fourth spacers.

16. The method of claim 15, wherein removing the first spacers comprises removing only the first spacers of the first and second spacers.

17. The method of claim 15, wherein the fourth spacers are formed on the second spacers.

18. The method of claim 15, wherein the fourth spacers contact the second spacers.

* * * * *